United States Patent
Guan et al.

(10) Patent No.: US 8,597,744 B2
(45) Date of Patent: Dec. 3, 2013

(54) DEVICE HOUSING AND METHOD FOR MAKING THE SAME

(75) Inventors: Xin-Wu Guan, Shenzhen (CN); Chao-Sheng Huang, Shenzhen (CN); Ren-Bo Wang, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 0 days.

(21) Appl. No.: 13/571,002

(22) Filed: Aug. 9, 2012

(65) Prior Publication Data

US 2013/0101765 A1 Apr. 25, 2013

(30) Foreign Application Priority Data

Oct. 21, 2011 (CN) .......................... 2011 1 0322923

(51) Int. Cl.
*B29D 22/00* (2006.01)
(52) U.S. Cl.
USPC .......................... 428/34.4; 428/34.6; 174/50

(58) Field of Classification Search
USPC ..................... 428/34.6, 34.4; 174/50; 40/564; 220/601, 602
See application file for complete search history.

(56) References Cited

U.S. PATENT DOCUMENTS

| | | | | |
|---|---|---|---|---|
| 2,085,277 | A * | 6/1937 | Smith | 220/602 |
| 7,589,893 | B2 * | 9/2009 | Rottcher | 359/443 |
| 7,812,256 | B2 * | 10/2010 | Zhan | 174/50 |
| 8,273,986 | B2 * | 9/2012 | Liu et al. | 174/60 |
| 2006/0035073 | A1 * | 2/2006 | Funkenbusch et al. | 428/336 |
| 2009/0148674 | A1 * | 6/2009 | Sheu | 428/201 |
| 2011/0235247 | A1 * | 9/2011 | Liao et al. | 361/679.01 |
| 2013/0101765 | A1 * | 4/2013 | Guan et al. | 428/34.6 |

* cited by examiner

*Primary Examiner* — N. Edwards
(74) *Attorney, Agent, or Firm* — Altis Law Group, Inc.

(57) ABSTRACT

A device housing includes a substrate and a decorative article formed in the substrate. The substrate defines a cutout therein and the decorative article is received in the cutout and bonded with the substrate. The decorative article is a glass article which is formed in the cutout by molding softened glass material into the cutout. A method for making the device housing is also provided.

8 Claims, 6 Drawing Sheets

DEVICE HOUSING AND METHOD FOR MAKING THE SAME

BACKGROUND

1. Technical Field

The present disclosure relates to device housing and a method for making the device housing.

2. Description of Related Art

Housings of electronic devices may be decorated by covering the surfaces of the housings with decorative articles. The decorative articles may be glass sheets. The glass sheets may be adhered on the surfaces by adhesive, such as glue. However, the adhered glass sheets have a tendency to detach from the housings during use.

Therefore, there is room for improvement within the art.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
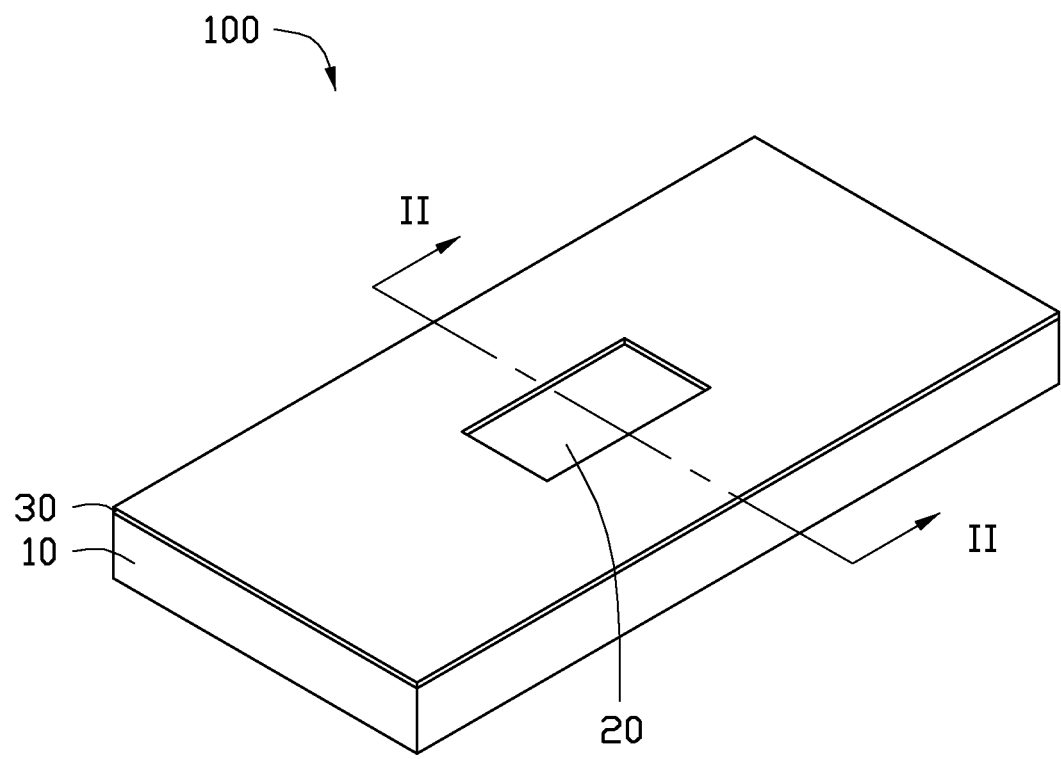
FIG. 1 is an isometric view of an exemplary embodiment of a device housing including a substrate.
Figure 2:
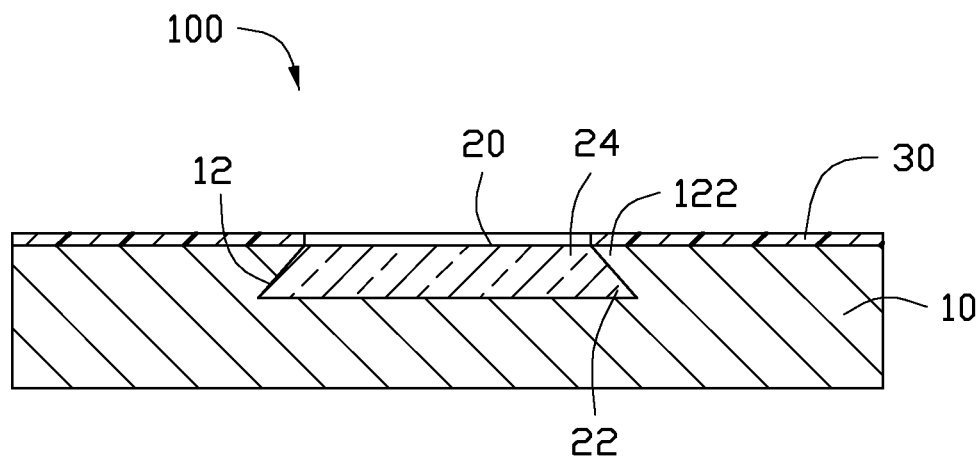
FIG. 2 is a cross-sectional view of the device housing shown in FIG. 1 take along line II-II.

Referring to FIGS. 1 and 2, a device housing 100 according to an exemplary embodiment includes a substrate 10, a decorative article 20 formed in the substrate 10, and a protective film 30 formed on the substrate 10.

The substrate 10 may be made of metal, such as stainless steel. The substrate 10 defines a cutout 12 therein. The cutout 12 may be circular. The substrate 10 defines a flange 122 at the opening of the cutout 12. The flange 122 extends along the cutout 12 towards the bottom wall of the cutout 12, and forms the peripheral wall of the cutout 12. The diameter of the cross-section of the cutout 12 gradually increases from the opening to the bottom wall of the cutout 12. That is, the diameter of the opening of the cutout 12 is smaller than that of the bottom wall of the cutout 12.

The decorative article 20 is received in the cutout 12 and directly bonded with the substrate 10. The decorative article 20 is a glass article. The decorative article 20 may be designed as an identifier of characters, patterns, and/or brand. The decorative article 20 may be formed by molding glass in the cutout 12. The decorative article 20 has a shape mating with the cutout 12. The decorative article 20 includes a bottom end 22 and a top end 24. The bottom end 22 is larger than the top end 24. The bottom end 22 catches with the flange 122 of the substrate 10 to secure the decorative article 20 in the cutout 12.

The protective film 30 is for improving the abrasion resistance and corrosion resistance of the substrate 10. The protective film 30 may be a vacuum deposition layer.

A method for making the device housing 100 may include the following steps.

Figure 3:
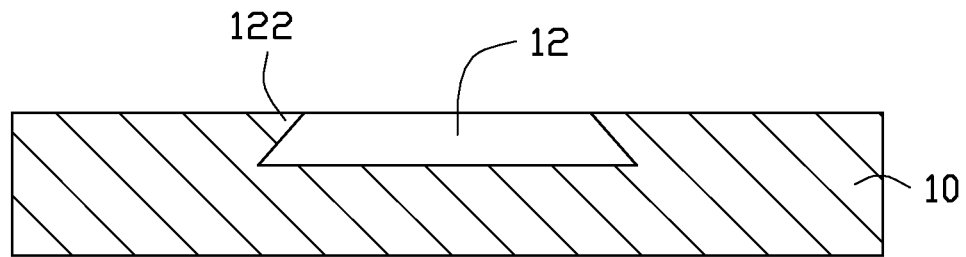
FIG. 3 is a cross-sectional view of an exemplary embodiment of the substrate of the device housing shown in FIG. 2 defining a cutout therein.

Referring to FIG. 3, the substrate 10 is provided. The surface of the substrate 10 is then polished.

Figure 4:
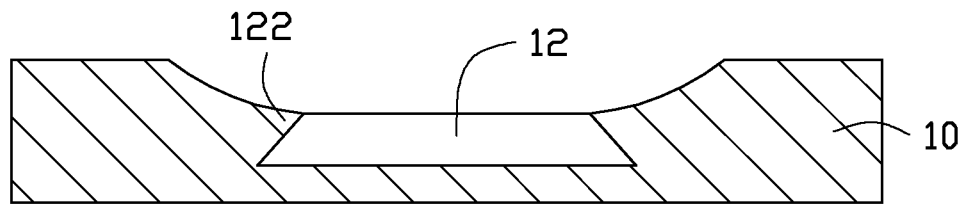
FIG. 4 is a cross-sectional view of an exemplary embodiment of the substrate having a concave surface and a cutout defined in the concave surface.
Figure 5:
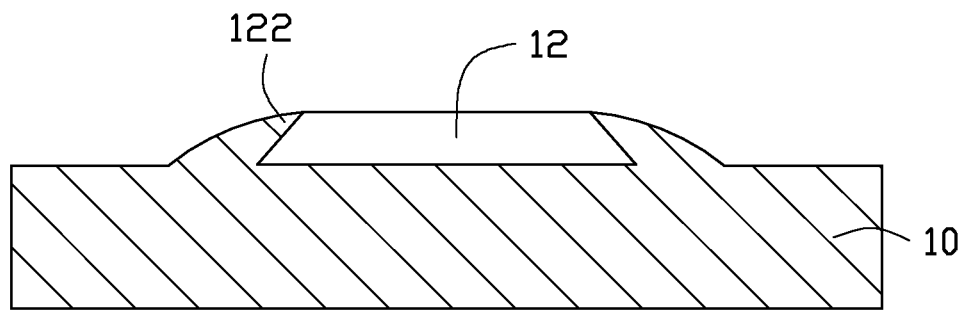
FIG. 5 is a cross-sectional view of an exemplary embodiment of the substrate having a convex surface and a cutout defined in the convex surface.

The substrate 10 is etched to form the cutout 12. The cutout 12 may be defined in the planar surface of the substrate 10, or the concave or convex surfaces of the substrate 10 (see FIGS. 4 and 5).

A furnace (not shown) is provided. Glass material is then fed into the furnace to be softened. The glass is aluminosilicate glass, and softens in the furnace at an internal furnace temperature of about 800° C. Subsequently, the softened glass is molded in the cutout 12 of the substrate 10 and then cooled to solidify and form the decorative article 20. The furnace is provided by Luoyang Xing Ming non-standard equipment limited company (type: FY-R-2).

During the molding process, the softened glass material directly contacts the peripheral wall of the cutout 12 of the substrate 10 and the heat of the glass material heats the peripheral wall. The heating of the peripheral wall creates a strong and direct bond between the decorative article 20 and the substrate 10. Furthermore, the bottom end 22 of the decorative article 20 is locked in position by the flange 122 of the substrate 10. Thereby the decorative article 20 will not separate from the substrate 10.

The molded decorative article 20 is polished to smoothen its surface. The surface of the substrate 10 is then polished once more to eliminate any contamination formed during molding the decorative article 20.

The decorative article 20 is masked by printing ink or by a film (not shown) for vacuum depositing the protective film 30 on the substrate 10.

The printing ink or the film covered on the decorative article 20 is removed to complete the device housing 100.

Figure 6:
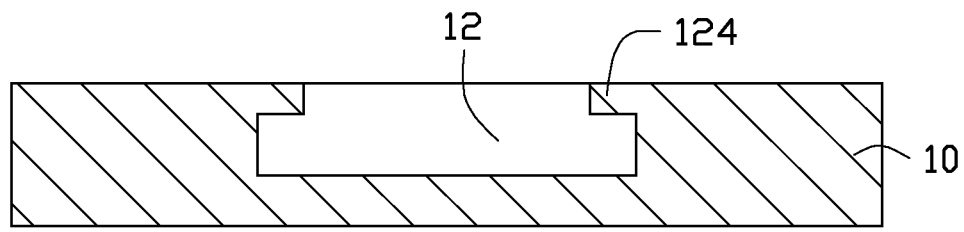
FIG. 6 is a cross-sectional view of another exemplary embodiment of the substrate of the device housing.

Alternatively, the cutout 12 may have other shapes, such as shown in FIG. 6, for example. A flange 124 is also formed at the opening of the cutout 12 to lock the decorative article 20 in position.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A device housing, comprising:
   a substrate defining a cutout therein, the cutout comprises an opening; and
   a decorative article formed in the cutout, the decorative article being a glass article;
   wherein the substrate defines a flange at the opening of the cutout, the decorative article comprises a bottom end directly bonding with the substrate, the bottom end of the decorative article is locked in position by the flange of the substrate at the opening of the cutout.

2. The device housing as claimed in claim 1, wherein the cutout comprises a bottom wall, the diameter of the opening is smaller than the diameter of the bottom wall.

3. The device housing as claimed in claim 2, wherein the decorative article further comprises a top end, the bottom end has a cross section larger than that of cross section of the top end.

4. The device housing as claimed in claim 3, wherein the flange extends along the cutout towards the bottom wall of the cutout and forms a peripheral wall of the cutout.

5. The device housing as claimed in claim 1, wherein the substrate is made of stainless steel.

6. The device housing as claimed in claim 1, further comprising a protective film formed on the substrate.

7. The device housing as claimed in claim 1, wherein the protective film is a vacuum deposition layer.

8. The device housing as claimed in claim 1, wherein the glass article is an aluminosilicate glass article.

* * * * *